US009036446B2

(12) United States Patent
Terzioglu et al.

(10) Patent No.: US 9,036,446 B2
(45) Date of Patent: May 19, 2015

(54) GLOBAL RESET WITH REPLICA FOR PULSE LATCH PRE-DECODERS (71) Applicant: QUALCOMM Incorporated, San Diego, CA (US)

(72) Inventors: Esin Terzioglu, San Diego, CA (US); Changho Jung, San Diego, CA (US); Shahzad Nazar, Cupertino, CA (US); Balachander Ganesan, San Diego, CA (US); Alex Dongkyu Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 149 days.

(21) Appl. No.: 13/663,042

(22) Filed: Oct. 29, 2012

(65) Prior Publication Data

US 2013/0223178 A1 Aug. 29, 2013

(51) Int. Cl.
G11C 8/00 (2006.01)
G11C 8/10 (2006.01)

(52) U.S. Cl.
CPC ........................................ G11C 8/10 (2013.01)

(58) Field of Classification Search
None
See application file for complete search history.

(56) References Cited

U.S. PATENT DOCUMENTS

| 5,386,150 | A | 1/1995 | Yonemoto |
| 5,404,334 | A | 4/1995 | Pascucci et al. |
| 5,497,475 | A | 3/1996 | Alapat |
| 5,822,252 | A | 10/1998 | Lee et al. |
| 5,825,691 | A | 10/1998 | McClure |
| 5,848,022 | A * | 12/1998 | Jiang ......................... 365/230.08 |
| 5,959,934 | A | 9/1999 | Chen et al. |
| 6,026,036 | A | 2/2000 | Sekiya et al. |
| 6,181,635 | B1 | 1/2001 | Bae |
| 6,304,510 | B1 | 10/2001 | Nobunaga et al. |
| 6,625,706 | B2 | 9/2003 | Campanale et al. |
| 6,700,822 | B1 | 3/2004 | Wang |
| 6,809,983 | B2 | 10/2004 | Jung |
| 7,221,602 | B2 | 5/2007 | Micheloni et al. |
| 7,319,632 | B2 | 1/2008 | Jung |
| 7,360,036 | B2 | 4/2008 | Knupfer et al. |
| 7,518,947 | B2 | 4/2009 | Starnes |
| 7,593,275 | B2 | 9/2009 | Sugamoto |
| 7,760,562 | B2 | 7/2010 | Jung et al. |
| 7,881,147 | B2 | 2/2011 | Chen et al. |
| 7,948,787 | B2 | 5/2011 | Ishikura et al. |
| 8,811,109 | B2 | 8/2014 | Terzioglu et al. |
| 2004/0264282 | A1 | 12/2004 | Penney |
| 2011/0317499 | A1 | 12/2011 | Bunce et al. |
| 2013/0223176 | A1 | 8/2013 | Terzioglu et al. |
| 2014/0355365 | A1 | 12/2014 | Jung et al. |

* cited by examiner

Primary Examiner — Kretelia Graham
(74) Attorney, Agent, or Firm — Paul S. Holdaway (57) ABSTRACT A global reset generation method for a pulse latch based pre-decoders in memories that comprises generating a pre-decoded memory address output for a pulse latch circuit, generating a reset signal to reset the pulse latch circuit, providing a combined signal of the pre-decoded memory address output and the reset signal, feeding the combined signal into a low voltage threshold device to manipulate resetting the pulse latch circuit, wherein generating a reset signal comprises generating a reset signal from a matched circuit that is configured to mimic the function of the latch circuit to be reset and wherein generating a reset signal comprises configuring the matched circuit to accommodate a worst case hold pulse delay to allow for resetting the pulse latch before a new clock cycle performs the resetting and having the matched circuit provide the reset signal and a pre-decoded memory address output in the same voltage domain.

9 Claims, 5 Drawing Sheets

GLOBAL RESET WITH REPLICA FOR PULSE LATCH PRE-DECODERS

CROSS REFERENCE TO RELATED APPLICATIONS

The present application is related to co-pending U.S. application Ser. No. 13/463,873 filed on May 4, 2012 and entitled "MEMORY PRE-DECODER CIRCUITS EMPLOYING PULSE LATCH(ES) FOR REDUCING MEMORY ACCESS TIMES, AND RELATED SYSTEMS AND METHODS", which claims priority to U.S. Provisional Patent Application Ser. No. 61/603,480 filed on Feb. 27, 2012 and entitled "PULSED LATCH-BASED MEMORY PRE-DECODING CIRCUITS FOR MEMORY, AND RELATED SYSTEMS AND METHODS", which are hereby incorporated herein by reference in their entirety.

FIELD OF DISCLOSURE

The present application relates to generating pulse latch resets, and more particularly to creating a pulse latch reset using replica circuits for pulse latch pre-decoders.

BACKGROUND

A pulsed-latch circuit can be modeled as a fast flip-flop. This allows conventional flip-flop designs to migrate to pulse-latch versions by simple replacement to reduce the clocking power. A step in the migration process is to insert pulsers, which generate clock pulses to drive local latches. It is desirable to minimize the number of pulsers as well as the wire length of clock routing to reduce the clocking power. Latches may be used as storage devices in memory circuits.

Memory arrays are common VLSI building blocks for many kinds of integrated circuits. One reason for the utility of memory arrays is that memory arrays can be extremely dense, resulting from their regular wiring. Memories come in many different types (RAM, ROM, EEPROM) and there are many different types of cells as well, but the basic idea and organization between them is similar. For each memory block, there are peripheral circuits, such as decoders, multiplexers, word line column select, and bit line drive circuits. Therefore, for added flexibility in operation, memory arrays such as Static Random Access Memories (SRAMs) or Dynamic Random Access Memories (DRAMs) typically would employ decoding mechanisms, for example two dimensional decoding, where a subset of the address accesses a single row of the array (the row address), and a separate subset is used to select a fraction of all the columns accessed within the row.

Memory pre-decoder circuits are employed to pre-decode portions of memory addresses prior to final decoding by a decoder. For example, a memory pre-decoder circuit may pre-decode a portion of a memory address that identifies a row of memory cells in memory. The pre-decoded portion of the memory address can be provided to a corresponding row decoder. The row decoder then selects the row in memory based on the pre-decoded portion of the memory address from the memory pre-decoder circuit.

One drawback is that a memory address input pin may be susceptible to unwanted spurious signals that may propagate through the circuit while a pulse latch based pre-decoder is active. Therefore there is a need for pulse latch based pre-decoders to be reset in order to block or keep spurious input pin changes from affecting the input memory address during a hold time requirement. This type of reset signal generation needs to give proper latching margins for pre-decoded addresses across process, voltage and temperature (PVT). Once the proper data has been latched, the latch should be deactivated. This helps ensure that the circuit is robust and can accommodate process variations. Therefore a latch reset mechanism, circuit, or signal is needed to prevent spurious data once the proper data has been latched.

These and other aspects of the invention will become apparent from the following description.

SUMMARY

Embodiments of the disclosure are directed to systems and methods for global reset with replica circuits for pulse latch pre-decoders.

Exemplary embodiments of the disclosure are directed to systems and method for reset generation for pulse latch based pre-decoders in memories that include providing at least one matched circuit and a plurality of pulse latches, wherein the at least one matched circuit mimics at least one pulse latch and generates a signal telling the at least one pulse latch that new data has been latched successfully.

Another exemplary embodiment is directed to a circuit for pulse-latch based pre-decoders in memories including at least one memory pre-decoder configured to pre-decode a memory address input to generate a pre-decoded memory address output for a pulse latch circuit and also includes at least one pulse latch circuit that is coupled to the memory pre-decoder and is configured to sample the pre-decoded memory address output based on a clock signal or a reset signal.

Another exemplary embodiment is directed towards a global reset generation method for a pulse latch based pre-decoders in memories that comprises generating a pre-decoded memory address output for a pulse latch circuit, generating a reset signal to reset the pulse latch circuit, providing a combined signal of the pre-decoded memory address output and the reset signal, and feeding the combined signal into a low voltage threshold device (LVT) to manipulate resetting the pulse latch circuit. The exemplary embodiment further includes wherein generating a reset signal further comprises generating a reset signal from a matched circuit that is configured to mimic the function of the latch circuit to be reset and wherein generating a reset signal further comprises configuring the matched circuit to accommodate a worst case hold pulse delay to allow for resetting the pulse latch before a new clock cycle performs the resetting and further wherein configuring the matched circuit further comprises providing a reset signal and a pre-decoded memory address output in the same voltage domain and wherein generating a pre-decoded memory address output for a pulse latch circuit further comprises selecting a specified latch circuit to manipulate.

Another exemplary embodiment is directed to a circuit comprising a first latch circuit comprising a first node, a pull-down transistor to pull the first node low when ON, the pull-down transistor comprising a gate, a pre-decoder coupled to the gate of the pull-down transistor and a second latch circuit to provide a reset signal to the pre-decoder, the reset signal is configured to turn off the pull-down transistor. The exemplary embodiment is further directed to wherein the memory pre-decoder is configured to pre-decode a memory address input to generate a pre-decoded memory address output, wherein the pre-decoded memory address output is configured to be fed through the gate of the pull-down transistor, wherein a system clock coupled to the source of the pull-down transistor is configured to produce a clock signal that allows the first latch circuit to reset, wherein the memory clock and the pre-decoder both operate in the low Vdd voltage domain and wherein the circuit comprises a second node configured to provide an output, wherein the second latch is configured to match the first latch circuit and further comprises a first matched node, a matched pull-down transistor to pull the first matched node low when ON, wherein the matched pull-down transistor comprises a matched gate and wherein the matched pull-down transistor is configured to share a common link with the pull-down transistor of the first latch circuit and a second matched node configured to provide a matched output and wherein the matched output is configured to provide a reset signal to the pre-decoder to reset the first latch circuit.

Another exemplary embodiment is directed towards a global reset generation apparatus for a pulse latch based pre-decoders in memories that comprises means for generating a pre-decoded memory address output for a pulse latch circuit, means for generating a reset signal to reset the pulse latch circuit, means for providing a combined signal of the pre-decoded memory address output and the reset signal, and means for feeding the combined signal into a low voltage threshold device (LVT) to manipulate resetting the pulse latch circuit. The exemplary embodiment further includes wherein means for generating a reset signal further comprises means for generating a reset signal from a matched circuit that is configured to mimic the function of the latch circuit to be reset and wherein means for generating a reset signal further comprises means for configuring the matched circuit to accommodate a worst case hold pulse delay to allow for resetting the pulse latch before a new clock cycle performs the resetting and further wherein means for configuring the matched circuit further comprises means for providing a reset signal and a pre-decoded memory address output in the same voltage domain and wherein means for generating a pre-decoded memory address output for a pulse latch circuit further comprises means for selecting a specified latch circuit to manipulate.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure relevant details of the illustrative embodiments herein.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments may be described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action. A latch reset signal is required to prevent new data latching-in after a required hold time.

Figure 1:
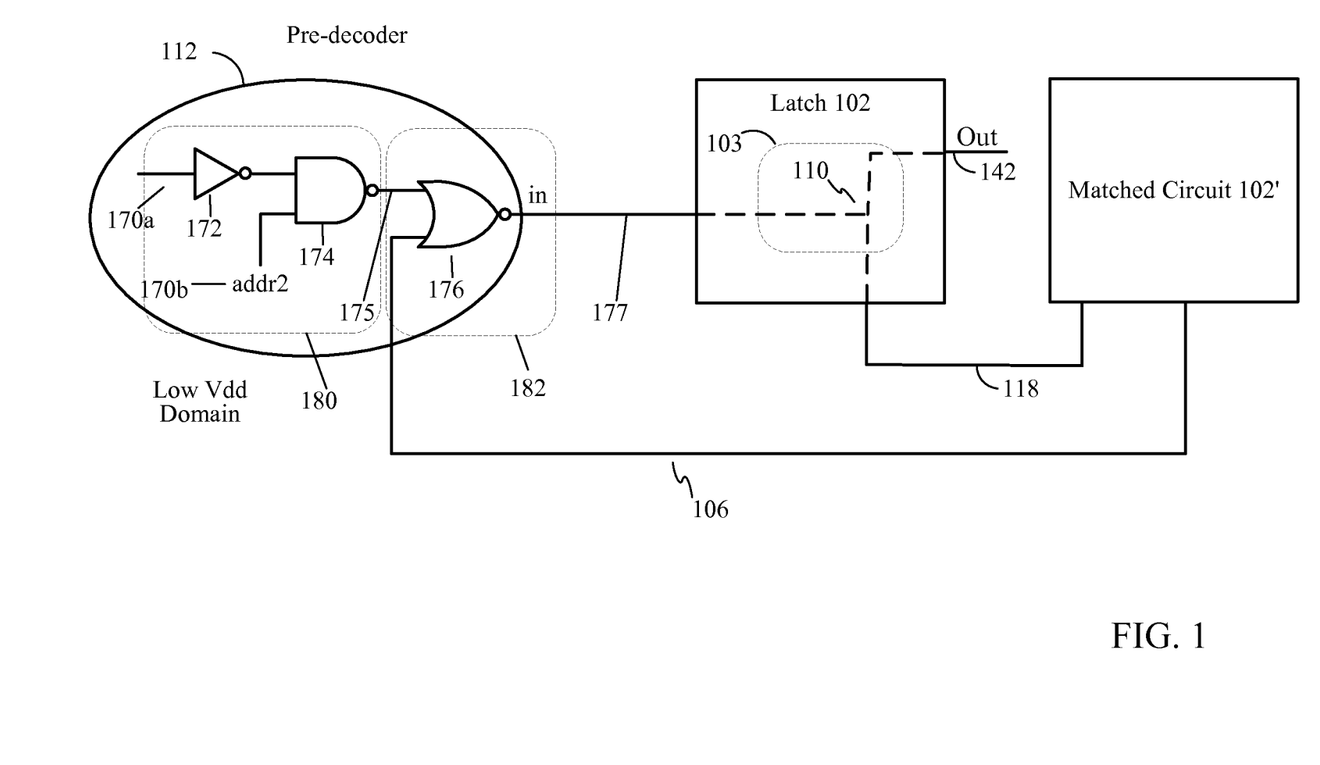
FIG. 1 is a graphic illustration of an exemplary pulse latch reset system overview using a matched circuit in accordance with an exemplary embodiment of the invention.

FIG. 1 shows a system view of an exemplary wireless communication system in which an embodiment of the invention may be advantageously employed. The wireless communication system may include a memory pre-decoder 112, a pulse latch circuit 102, configured to hold a voltage at storage node 110 and output a pre-decoded memory address output 142, a matched circuit 102' configured to be matched to pulse latch circuit 102 and outputs a reset signal to reset pulse latch circuit 102, and a common pull-down 118 configured to link the two circuits. Pulse latch circuit 102 may hold the voltage at storage node 110 which is incorporated within an internal latch circuit 103 that will be further discussed below.

Taking a closer look at memory pre-decoder 112, the circuit is configured to receive a memory address input 170a and 170b from a CPU core (not shown). It should be noted that additional memory pre-decoder circuits may be provided to pre-decode different portions of the memory address from the CPU core.

If the CPU core is powered in a low Vdd voltage domain, the memory address inputs 170a and 170b are received by the memory pre-decoder 112 in a low Vdd voltage domain as well. However, memory systems, such as static random access memory (SRAM), dynamic random access memory (DRAM), read only memory (ROM), erasable programmable read only memory (EPROM), electronically erasable programmable read only memory EEPROM, etc., are generally powered by a high voltage domain. This can advantageously allow the memory system to maintain a threshold voltage to help preserve the integrity of data stored in the memory cells.

The pre-decoding provided by the memory pre-decoder 112 is utilized to partially decode the memory address, which allows for the simplification of downstream peripheral circuitry, such as a final decoder (not shown) of a memory system. In one overview example, the pulse latch circuit 102 may be presumed to sample the pre-decoded memory address input 177 in response to a system clock (not shown). However, in alternative embodiments, the pulse latch circuit 102 may be configured to sample the pre-decoded memory address input 177 in response to a rising edge of the system clock. In any case, a signal level is stored in the pulse latch circuit 102 according to a signal level of the pre-decoded memory address input 177 in the low voltage domain. The pulse latch circuit 102 is also configured to generate a pre-decoded memory address output 142. The pre-decoded memory address output 142 is output during the active edge of the system clock in accordance with the signal level stored at storage node 110 by the pulse latch circuit 102. The signal level of the pre-decoded memory address output is reset before the next active clock edge. More specifically, the pulse latch circuit 102 becomes transparent, i.e. open to receive an input, and samples the pre-decoded memory address input 177 in response to the next active edge of the system clock.

Although not required, the pulse latch circuit 102 samples the pre-decoded memory address input 177 in the low voltage domain but generates the pre-decoded memory address output 142 in the high voltage domain. As a result, a voltage level shifter does not have to be provided in the memory pre-decoder 112.

With continuing reference to FIG. 1, the memory pre-decoder 112 is configured to pre-decode the memory address inputs 170a and 170b to generate and output pre-decoded memory address input 177, which is configured to be fed into pulse latch circuit 102. Accordingly, the memory pre-decoder 112 is configured to pre-decode the memory address inputs 170a and 170b in the low voltage domain to generate a pre-decoded memory address input 177 in the low voltage domain. The pulse latch circuit 102 is configured to sample the pre-decoded memory address input 177 in the low voltage domain based on a clock signal from the system clock (not shown). The pulse latch circuit 102 samples the pre-decoded memory address input 177 on an active edge of a system clock signal (shown in FIGS. 2 and 3). For example, the pulse latch circuit 102 is presumed to sample the pre-decoded memory address input 177 in response to a rising edge of the system clock. However, in alternative embodiments, the pulse latch circuit 102 may be configured to sample the pre-decoded memory address input 177 in response to a falling edge of the system clock.

A signal level is stored in the pulse latch circuit 102 according to a signal level of the pre-decoded memory address input 177 in the low voltage domain. The pulse latch circuit 102 is configured to generate a pre-decoded memory address output 142. The pre-decoded memory address output 142 is launched during the active edge of the system clock in accordance with the signal level stored by the pulse latch circuit 102. The signal level of the pre-decoded memory address output 142 is reset before the next active clock edge. More specifically, the pulse latch circuit 102 again becomes transparent and samples the pre-decoded memory address input 177 in response to the next active edge of the system clock.

The memory pre-decoder 112 shown in FIG. 1 generates the pre-decoded memory address input 177 as a pre-decoded input of a pre-decoded memory address 170a in this example. The memory address input 170a is representative of information for selecting a wordline and/or a bitline in the memory. The pulse latch circuit 102 is configured to receive the pre-decoded memory address input 177 from the memory pre-decoder 112 as the pre-decoded input of the pre-decoded memory address. The pre-decoded memory address output 142 is thus generated by the pulse latch circuit 102 as a pre-decoded output of the pre-decoded memory address. The pre-decoded output (and other pre-decoded outputs from other pulse latches in parallel implementations) may be provided to a final downstream (row/bitline) decoder(s) (not shown). In response, the decoder may select a wordline/bitline of memory cells in the memory based on the pre-decoded output (along with the other pre-decoded outputs from pulse latches in parallel implementations).

With continuing reference to FIG. 1, the circuit diagram includes exemplary embodiments of the memory pre-decoder 112 including address pre-decode logic circuit 180. The address pre-decode logic circuit 180 receives the memory address inputs 170a and 170b as a plurality of memory address inputs. The memory address inputs 170a and 170b of this embodiment are bits from a memory address (not shown). In this example, the memory address input 170a is received initially by an inverter gate 172. After inversion by the inverter gate 172, the memory address input 170a is provided to a NAND gate 174 in the address pre-decode logic circuit 180. The memory address input 170b is directly received by the NAND gate 174.

The address pre-decode logic circuit 180 is configured to pre-decode the memory address inputs 170a, 170b and generate an intermediary pre-decoded address signal 175 from the address pre-decode logic circuit 180 of the memory address inputs 170a, 170b. A signal level of the intermediary pre-decoded address signal 175 represents pre-decoded information for downstream circuitry. In this example, the NAND gate 174 generates the intermediary pre-decoded address signal 175. It should be noted that while the address pre-decode logic circuit 180 has the inverter gate 172 and the NAND gate 174, this logic topology is not required. Other embodiments of the address pre-decode logic circuit 180 may have alternative logic topology depending on the pre-decoding scheme of the memory pre-decoder 112.

NOR gate 176 is configured to receive the intermediary pre-decoded address signal 175 from the address pre-decode logic circuit 180 and generate the pre-decoded memory address input 177 in accordance with the intermediary pre-decoded address signal 175. As explained in further detail below, the pulse latch circuit 102 receives the pre-decoded memory address input 177 from NOR gate 176 and generates the pre-decoded memory address output 142 based on the pre-decoded memory address input 177.

Furthermore, NOR gate 176 is configured to receive a reset signal 106, wherein NOR gate 176 takes in reset signal 106 along with intermediary pre-decoded address signal 175 and outputs a pre-decoded memory address input 177. Pre-decoded memory address input 177 may correspond to a specific latch in an array of pulse latch circuits configured to be reset. Taking pulse latch circuit 102 as an example, pulse latch circuit 102 can be either open (subject to external input) or closed (able to block external input). When the pulse latch circuit 102 is closed, the pulse latch circuit 102 is opaque and thus may not be susceptible to unwanted spurious signals. As such, changes in the pre-decoded memory address input 177 do not affect the pre-decoded memory address output 142. Such changes may include changes in the voltage level of the signals. In this exemplary embodiment, when the NOR gate 176 receives the reset signal 106, if the reset signal 106 is in a non-reset signal state, the NOR gate 176 is configured to generate the pre-decoded memory address input 177 in accordance with the intermediary pre-decoded address signal 175. Reset signal 106 is in a non-reset state when its value is LOW. To the contrary, reset signal 106 is in a reset state when its value is HIGH.

The NOR gate 176 is configured to reset the pre-decoded memory address input 177 when the reset signal 106 is in a reset signal state, i.e. HIGH. More specifically, the NOR gate 176 generates the pre-decoded memory address input 177 with a low Vdd voltage level when the reset signal 106 is HIGH, regardless of the voltage level of the intermediary pre-decoded address signal 175. The pulse latch circuit 102 thus becomes opaque to changes within the intermediary pre-decoded address signal 175 and also the memory address inputs 170a, 170b while the reset signal 106 is in the reset signal state. Accordingly, when the pulse latch circuit 102 becomes opaque and consequently closed during reset operations, changes in the system clock activity (HIGH or LOW) do not affect the pulse latch circuit 102. Once the reset signal 106 returns to the non-reset signal state, the pulse latch circuit 102 may open again when the system clock becomes active during the next clock cycle.

The memory pre-decode setup sets the pre-decoded memory address input 177 before the clock signal transitions to HIGH. Accordingly, the setup time for the pre-decoded memory address input 177 is determined with respect to the system clock. More specifically, the setup time required by the memory pre-decoder 112 is approximately equal to the combined propagation delay of the inverter gate 172, NAND gate 174, and NOR gate 176. Accordingly, as no latch or voltage level shifter is required in the memory pre-decoder 112, the setup time is only three "gates" long. Also, since the system clock does not need to be delayed with respect to another clock signal, the pulse latch circuit 102 can generate the pre-decoded memory address output 142 using a system clock from a CPU core as the system clock.

Although not specifically illustrated in FIG. 1, each of the components of the memory pre-decoder 112 operates in the low Vdd voltage domain. Accordingly, the memory address inputs 170a, 170b, the intermediary pre-decoded address signal 175, and the pre-decoded memory address input 177 each operate in the low Vdd voltage domain. The voltage level of the bits of the memory address inputs 170a, 170b, and the intermediary pre-decoded address signal 175 are, thus, represented in accordance with the voltage levels provided by the low Vdd voltage domain. The memory address inputs 170a, 170b may be from a CPU core (not shown) that is powered in the low Vdd voltage domain. Similarly, supply voltages that power the inverter gate 172, the NAND gate 174, and the NOR gate 176 are also configured in the low Vdd voltage domain. If the reset signal 106 has not already closed the pulse latch circuit 102, the pulse latch circuit 102 becomes opaque when the system clock is inactive. Otherwise, if the reset signal 106 has already closed the pulse latch circuit 102, the pulse latch circuit 102 remains opaque while the system clock is inactive. In this embodiment, the memory pre-decoder 112 is dynamic rather than static because the memory pre-decode setup path does not latch the memory address inputs 170a, 170b, the intermediary pre-decoded address signal 175, or the pre-decoded memory address input 177. Thus, changes to the pre-decoded memory address input 177 due to new memory address inputs 170a, 170b can be initiated as soon as the system clock becomes active and pulse latch becomes opaque due to reset signal 106.

Looking further at FIG. 1, the pulse latch circuit 102 has a storage node 110. Throughout this disclosure, the signal level stored at the storage node 110 is a voltage level. When the system clock signal is active, the pulse latch circuit 102 is configured to sample the pre-decoded memory address input 177 in the lower voltage domain. In the particular configuration shown in FIG. 1, the pulse latch circuit 102 samples the pre-decoded memory address input 177 by passing the pre-decoded memory address input 177 to the storage node 110 in response to the activating edge of the system clock signal 104. Additionally, while configured to receive a pre-decoded memory address input 177 in a low Vdd voltage domain, one exemplary embodiment allows the pulse latch circuit to be configured to output pre-decoded memory address output 142 in the high Vdd voltage domain. Accordingly, the pulse latch circuit 102 samples the pre-decoded memory address input 177 by passing the pre-decoded memory address input 177 in the low Vdd voltage domain to the storage node 110 as a preliminary pre-decoded memory address output in the high Vdd voltage domain once the system clock becomes active.

Figure 2:
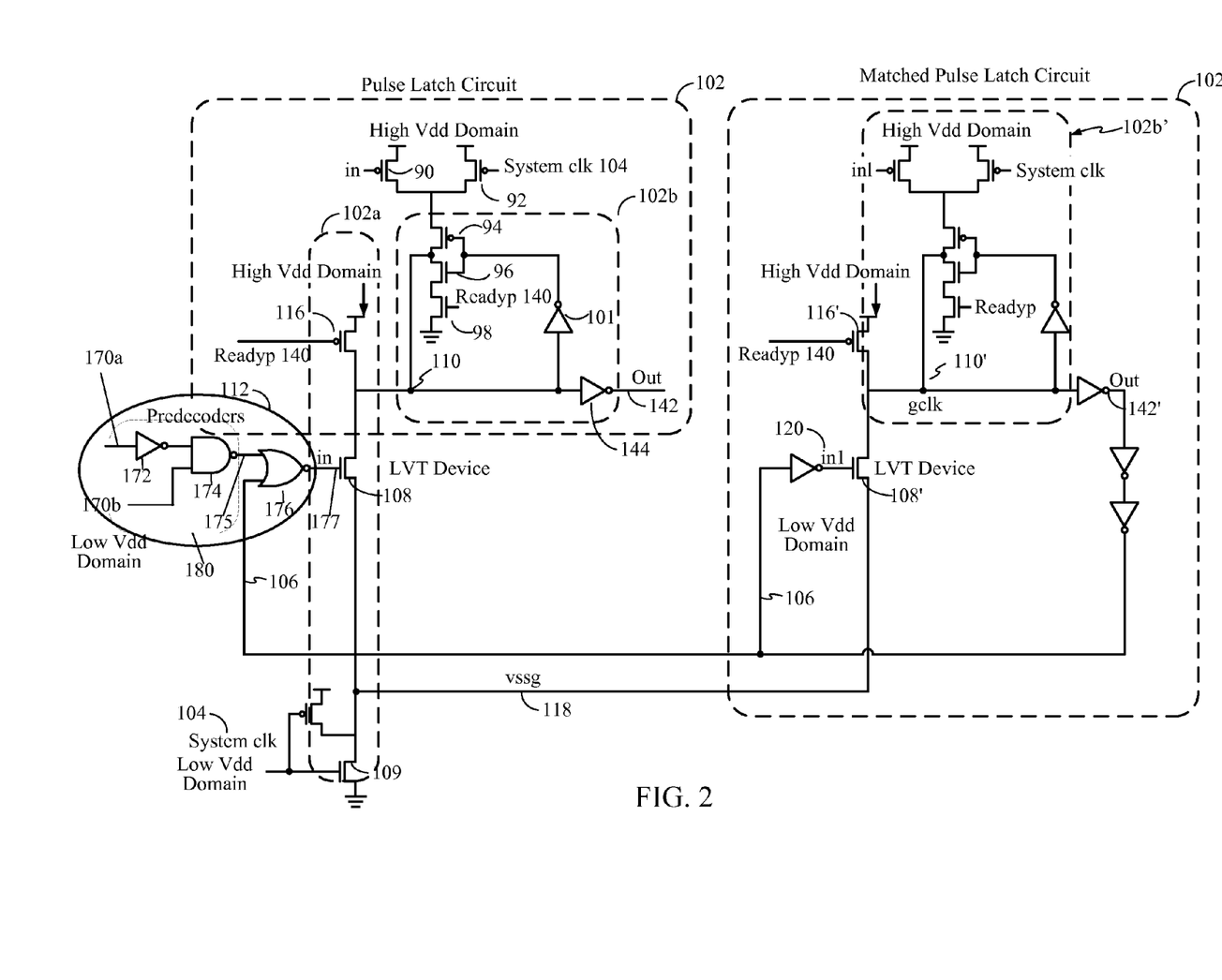
FIG. 2 is a graphic illustration of a pulse latch circuit, showing one example of a pulse latch reset in accordance with an exemplary embodiment of the invention.

Looking at FIG. 2 there is represented one exemplary embodiment of the reset latch circuitry with greater detail describing pulse latch circuit 102 and matched circuit 102'. System clock signal 104 represents one example implementation of a system clock configured to provide a clock signal for the system. When the system clock signal 104 is active, i.e., clock signal is HIGH, the pulse latch circuit 102 is transparent because changes in the intermediary pre-decoded address signal 175 (and thus, the memory address inputs 170a, 170b) affect the voltage level stored in the storage node 110. It should be noted, however, that the pulse latch circuit 102 may not be transparent for the entire time that the system clock signal 104 is active. As discussed above, NOR gate 176 may close the pulse latch circuit 102 in response to the reset signal 106 and the pulse latch circuit 102 becomes opaque prior to the system clock signal 104 becoming inactive. Conversely, the pulse latch circuit 102 may become opaque once the system clock becomes inactive. In either case, the pulse latch circuit 102 remains opaque while the system clock signal 104 is inactive. The pulse latch circuit 102 once again becomes transparent when the system clock signal 104 becomes active again and pulse latch circuit 102 has been reset. Consequently, the pulse latch circuit 102 is configured to sample the pre-decoded memory address input 177 based on the system clock signal 104.

With continuing reference to FIG. 2, the pulse latch circuit 102 has a first stage 102a that includes a P-channel field effect transistor (FET) 116, a pull-down device 108, and an N-channel FET pull-down device 108. A gate of the pull-down device 108 receives the pre-decoded memory address input 177, also noted as "In", and a gate of the N-channel FET 109 receives the clock signal of system clock signal 104. Pull-down transistor 108 is configured to pull down the voltage of the connected circuits to a LOW value. To pipeline the signal value of the pre-decoded memory address input 177 to the storage node 110, the signal value of the pre-decoded memory address input 177 should be setup by the memory pre-decoder 112 prior to the active edge of the clock signal 104. Throughout the description, clock signal and system clock signal 104 can be used interchangeably to mean the same thing, i.e., the output signal (active/inactive or HIGH/LOW) of the system clock signal 104. In this case, the clock signal 104 is active when the clock signal 104 HIGH. Prior to the rising edge of the clock signal 104, the P-channel FET 116 receives a Readyp signal 140 that turns on the P-channel FET 116 and resets the pulse latch circuit 102.

The first stage, 102a, of the pulse latch circuit 102 passes the pre-decoded memory address input 177 to the storage node 110 as the preliminary pre-decoded memory address output. The first stage 102a provides the preliminary pre-decoded memory address output as an inverted version of the pre-decoded memory address input 177 but in the high Vdd voltage domain. For example, if the pre-decoded memory address input 177 is set up at the gate of the pull-down device 108 to be HIGH, the rising edge of the clock signal 104 results in both the pull-down device 108 and the N-channel FET 109 to be turned ON. When both the pull-down device 108 and N-channel FET 109 are turned ON, they force the P-channel FETs 90 and 92 to be partially turned OFF despite the low Vdd voltage level at the gate of the P-channel FET 90 and 92. As a result, the majority of the voltage VDDH is dropped across the P-channel FET 90 and 92 and pre-decoded memory address output 142 goes HIGH. When the pre-decoded memory address input 177 is setup to be HIGH in the low Vdd voltage domain, the pulse latch circuit 102 stores the preliminary pre-decoded memory address output as LOW in the high Vdd voltage domain at the storage node 110.

Conversely, the pre-decoded memory address input 177 may be setup at the gate of the pull-down device 108 to be LOW and provided again in the low Vdd voltage domain. When the clock signal 104 is active, the pull-down device 108 is OFF and N-channel FET 109 is ON. This is because the LOW signal level at the gate of the pull-down device 108 turns OFF the pull-down device 108 even though the N-channel FET 109 is ON. The P-channel FET 90 thus remains ON and the majority of the voltage VDDH is dropped across the pull-down device 108 and N-channel FET 109. Accordingly, when the pre-decoded memory address input 177 is setup to be LOW, pulse latch circuit 102 stores the preliminary pre-decoded memory address output as HIGH in the high Vdd voltage domain at the storage node 110.

Once the voltage level at the storage node 110 has stabilized, the pulse latch circuit 102 should be closed. Closing the pulse latch circuit 102 makes it immune to changes in the intermediary pre-decoded address signal 175 and the memory address inputs 170a, 170b and stops the input values from entering into the storage node 110 too early. To prevent untimely changes, the memory pre-decoder 112 is configured to receive the reset signal 106 and close the storage node 110 of the pulse latch circuit 102 when the reset signal 106 is in the reset signal state. As discussed above, the NOR gate 176 receives the reset signal 106 in the reset signal state to close the pulse latch circuit 102. Accordingly, the pre-decoded memory address input 177 is reset to LOW regardless of the voltage level of the intermediary pre-decoded address signal 175. As a result, the pull-down device 108 must be turned OFF in response to the reset signal 106 being provided in the reset signal state. The pulse latch circuit 102 becomes opaque and the voltage level stored at the storage node 110 is unresponsive to changes in the intermediary pre-decoded address signal 175 and the memory address inputs 170a, 170b. As the pulse latch circuit 102 is opaque for at least as long as the reset signal 106 is in the reset signal state, i.e. HIGH, the reset signal 106 sets a minimum hold time of the pulse latch circuit 102. Hold time may be defined by looking at the difference of the inputs at the NOR gate 176. In this example, the hold time is defined as the delay difference between two delays: 1) the delay between the memory address inputs 170a and 170b entering the inverter gate 172 and the intermediary pre-decoded address signal 175 entering the NOR gate 176; and 2) the delay between system clock signal 104 and reset signal 106 entering the NOR gate 176.

In the above example, the memory pre-decoder 112 may be stacked in an array of multiple pre-decoders. Additionally, the input 170 may be configured to be representative of multiple address inputs, i.e. 1 to n inputs, each representing the possible selection 1 to n pulse latch circuit 102 circuits. In one embodiment, there may be assigned one matched circuit 102' that is designed to be common to all n latch circuits, wherein the reset signal 106 in combination with the intermediary pre-decoded address signal 175 helps determine which of the latch circuits will actually be reset.

The dynamic between the clock signal 104 and reset signal 106 plays a role in determining the opaque or transparent nature of the pulse latch circuit 102. In one embodiment, for example, the clock signal 104 becomes inactive when the system clock is at a falling edge. When the system clock is at a falling edge, and clock signal 104 is inactive, the N-channel FET 109 is turned OFF as a result and the pulse latch circuit 102 remains opaque. This means that pulse latch circuit 102 holds the voltage level at the storage node 110 as long as the clock signal 104 is inactive. Even when the reset signal returns to a non-reset state, i.e. LOW, if the clock signal 104 remains inactive, then pulse latch circuit 102 will nevertheless remain opaque.

The pulse latch circuit 102 is configured to generate the pre-decoded memory address output 142 in the high Vdd voltage domain based on the preliminary pre-decoded memory address output from the storage node 110. In this embodiment, the pulse latch circuit 102 includes an inverter gate 144 and the pre-decoded memory address output 142 is inverted with respect to the preliminary pre-decoded memory address output from the storage node 110. The first stage 102a of the pulse latch circuit 102 has a propagation delay approximately equal to one gate; the inverter gate 144 also has a propagation delay approximately equal to one gate. Accordingly, the pulse latch circuit 102 is configured to generate the pre-decoded memory address output 142 within two gates of the clock signal 104.

To hold the voltage level at the storage node 110 while the pulse latch circuit 102 is opaque, the pulse latch circuit 102 employs a feedback stage that constitutes inverter: 101, P-channel FET 94 and N-channel FET 96. As such the output of inverter 101 is coupled to the gates of the P-channel FET 94 and the N-channel FET 96. The gate of the N-channel FET 98 receives the readyp signal 140. To hold the voltage level at the storage node 110, the readyp signal 140 is transitioned to a HIGH as the reset signal 106 is transitioned to the reset signal state, i.e. HIGH. Accordingly, the N-channel FET 98 is allowed to be turned ON to provide a path to pull-down device 108 and ultimately to ground.

P-channel FET 94 and N-channel FET 96 can play a role in reinforcing the voltage level at the storage node 110 when the pulse latch circuit 102 is opaque. For example, when pulse latch circuit 102 is opaque, at minimum, either P-channel FET 90 or P-channel FET 92, or both, are turned ON when fed LOW input signals. For example, when the voltage level at the storage node 110 is HIGH, the gates of the P-channel FET 94 and N-channel FET 96 receive LOW inputs. Accordingly, the drains of the P-channel FET 94 and the N-channel FET 96 are ON and thus, the storage node 110 is driven to maintain HIGH value. In contrast, if the voltage level at the storage node 110 is at LOW, the gates of the P-channel FET 94 and the N-channel FET 96 receive a HIGH and the drains of the P-channel FET 94 and the N-channel FET 96 are driven towards LOW, near ground. Thus feedback stage (inverter 101, P-channel FET 94 and N-Channel FET 96) thus holds the voltage level at the storage node 110 when the pre-decoded memory address input 177 is provided to the P-channel FET 90 at LOW due to the reset signal 106 coupled with having the P-channel FET 92 receive the clock signal 104 also at LOW.

Therefore, after reset signal 106 closes the pulse latch circuit 102 and turns it into an opaque state, reset signal may return to a non-reset state, i.e. LOW. This does not alter the stable reset state the pulse latch circuit 102 is in and as such, having P-channel FET 90 and/or P-channel FET 92 be on maintains the stable reset state. The reset state is disrupted thereafter when clock signal 104 is active again, HIGH, turning pulse latch circuit 102 into a transparent state as discussed further below.

In yet another embodiment a method to store a new voltage level or signal at storage node 110 is disclosed. Prior to the clock signal 104 again becoming active, the readyp signal 140 may again be transitioned to a HIGH signal level. This deactivates the feedback stage 102b and the pulse latch circuit 102 again becomes transparent on the next rising edge of the clock signal 104. The first stage 102a of the pulse latch circuit 102 again receives the pre-decoded memory address input 177 in the low Vdd voltage domain and passes it to the storage node 110 as the preliminary pre-decoded memory address output in the high Vdd voltage domain. Thus, changes in the intermediary pre-decoded address signal 175 and the memory address inputs 170a, 170b do not affect the voltage level at the storage node 110 until the subsequent rising edge of the clock signal 104 occurs. The above described process may be again repeated by the pulse latch circuit 102 for the new voltage level at the storage node 110.

By using the reset signal 106 to deactivate the pulse latch circuit 102, the pulse latch circuit 102 does not require a deactivating edge of the clock signal 104 to deactivate. Instead, the pulse latch circuit 102 may be deactivated by either the reset signal 106 or the clock signal 104. Thus, some implementations of the pulse latch circuit 102 may use a system clock from a CPU core (not shown), or the like, as the clock signal 104. The reset signal 106 may be generated by a matched circuit 102'. Matched circuit 102' can be configured to match the pulse latch circuit 102 in layout, design, and/or performance. In one example, the matched circuit may be realized by fabricating a replica circuit. For example, matched circuit 102' may be fabricated to mimic the pulse latch circuit 102 and generates the reset signal 106 with the reset signal state whenever the voltage level of the storage node 110 has been stabilized and in need of a reset. In some implementations, the reset signal 106 resets the pre-decoded memory address input 177 and thus deactivates the pulse latch circuit 102 each time the clock signal 104 is active.

Figure 3:
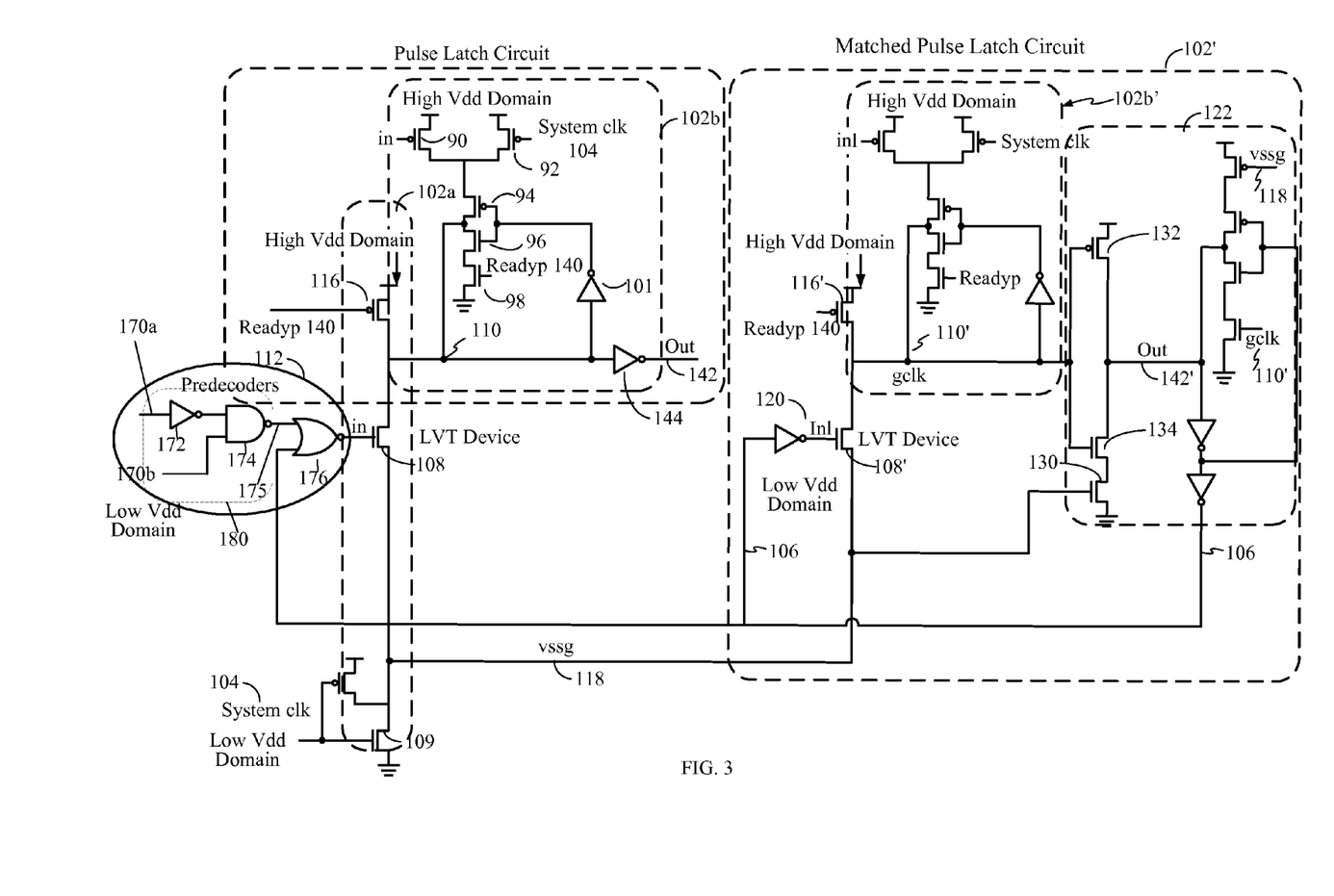
FIG. 3 is a graphic illustration of a robust pulse latch reset circuit, in accordance with one embodiment of the invention.

FIGS. 2 and 3 illustrate two possible embodiments for possible designs of the matched circuit 102'. The matched circuit's primary usefulness is to remove the need to place multiple delays that create a desired long hold time. The disclosed matched circuits allow for the incorporation of multiple functions all to be combined into one circuit. For example, to include decoding, registering, level shifting and buffering or their like effects to take place all within a single circuit. Looking at FIG. 2, reset signal 106 is generated as a HIGH voltage signal through storage node 110' (a matched equivalent of storage node 110 found in the latch circuit 102) and output node/signal 142'. Output signal 142' is configured to go through two inverter gates before becoming reset signal 106. In one embodiment, the reset signal 106 is used to allow memory pre-decoder 112 to be reset in order to keep input pin changes from going through the latch circuit, i.e., to keep the latch circuit 102 opaque. As previously discussed, memory pre-decoder 112 may be arranged as a single pre-decoder or may be arranged in an array of pre-decoder formats.

Referring to FIG. 2, for example, a hold time is caused by the gate present in the latch system 102, in which the latch is level sensitive as opposed to edge sensitive. In one embodiment, if the system clock signal 104 is high, it latches the input. Latch system 102 may include a latch circuit, a level shifter circuit and an output driver circuit. In one embodiment latch circuit 102 may have a readyp signal 140 as a high or low input. As can be seen from FIG. 1, readyp signal 140 is connected to a pull up P-channel FET 116 for pulling up the storage node 110 to the high Vdd domain voltage.

In yet another embodiment, latch circuit 102 may include an output driver circuit (included within feedback circuit 102b). The output driver circuit may include a standard digital CMOS output driver circuit which may comprise a series of tapered inverters, wherein each inverter is driving another larger inverter until an inverter is large enough to drive an external load capacitance within a reasonable amount of time. The need for the output driver circuit is to ensure a proper match between drive and load characteristics in order to maintain control signal integrity between the devices. For example, with too little drive, there may be a loss in output voltage and with too much drive there may be a risk of signal noise as a result of fast edge rates. In one embodiment, the output driver circuit may be a static output driver. A static output driver uses a current capacity of an output used to either maintain or change the voltage level of an output. An output that is static is not changing or switching and is thus trying to maintain a DC voltage level. Static output drive of a device may be the measure of the current available at a steady state. In yet another embodiment, output driver circuit may utilize dynamic output drive, which is the output current available during the transition or switching of an output. Dynamic output drive provides the switching strength necessary to overcome a loaded environment when changing the state of the output. The driving device may effectively transition from sinking to sourcing current or vice versa. The dynamic drive strength of a device may define the switching speed of the device in various applications.

As a starting point, which may also be considered an initial condition or a pre charge state for the circuits, the input to each of the pull-down devices 108 and 108' may operate at the low Vdd voltage level. pull-down devices 108 and 108' may be LVT (Low Voltage Threshold) devices and may also be employed for the system clock signal 104 input into pulse latch circuit 102 and matched latch 102'. As discussed above, the system clock signal 104 also operates in a low Vdd domain. Further discussing the initial condition, readyp signal 140 is fed as a LOW signal, which prompts the matched circuit 102' to enter into a pre-charge mode. For example, when readyp signal 140 is LOW, matched storage node 110' becomes HIGH and output signal 142' becomes HIGH. As such, after going through 2 inverters and being fed back through inverter, which outputs input signal in1 120, pull-down device 108' input is also HIGH.

In another embodiment of the pre charge state, the pre-charge state may indicate that the initial potential at inputs (readyp signal 140, input signal in1 120 and pre-decoded memory address input 177) are all HIGH and that the output at (storage node 110 and pre-decoded memory address output 142) are HIGH also. When these physical characteristics are present, the system is operating at a pre-charge state. As an initial phase, when the system clock signal starts to ramp up to a high value, storage node 110 and 110' may be discharged to ground. Given the schematic of the circuit however, and because storage node 110 is connected to memory pre-decoder 112, the discharge to ground for storage node 110 will depend on the value of pre-decoded memory address input 177 signal that is output from the memory pre-decoder 112. This design may yield system characteristics that do not have optimal discharge characteristics. For example, when the system clock signal 104 goes to HIGH, the common pull down link between the replica circuit and the latch circuit, vssg 118

(connected to common pull down pull-down device 108, may discharge to ground. In this case, storage node 110 and both pull-down devices 108 and 108' may be discharged as well. However, the rate of discharge at storage node 110' is fast enough to cause output signal 142' to be HIGH and reset signal 106 to be HIGH as well before storage node 110 discharges fully.

In one exemplary embodiment, a reset signal is implemented to prevent new data from latching after a required hold time. A matched circuit may be used to produce the reset signal. For example, matched circuit 102' can be a tunable matched circuit, which may be used with error detection schemes, as well as dynamic voltage and frequency techniques to adapt to varying parameters, including voltage, temperature and aging variation. In yet another embodiment, a combination of high and low voltage domains are utilized as indicated in the circuit and throughout the specification. The main reason for using the low voltage domain is that it helps guarantee circuit adoption for a worst case condition which guarantees the biggest margin for the hold times.

Several scenarios can be implemented to allow the circuit to latch and reset properly. Such scenarios depend on the state and voltage level of each node/device as discussed in more detail below. For example, when the value of pre-decoded memory address input 177 and input signal inl 120 goes to LOW, pull-down devices 108 and 108' will be turned OFF. This causes storage node 110 and its counterpart in matched circuit, 110', to be latched by the latch circuit. Thereafter, readyp signal 140 may go to a LOW state, causing the P-channel FET 116 and 116', its counterpart in matched circuit 102', to turn ON. Having storage nodes 110 and 110' latched by the latch circuit, readyp signal 140 may go to HIGH state thereafter causing storage nodes 110 and 110' to sustain their status as when they have been latched. In this case, their output status may be sustained by the feedback device as discussed above. If matched storage node 110' is in HIGH state, output signal 142' may be in LOW state as a result and reset signal 106 may be in LOW state as well. This scenario would lead to having input signal M1 120 to go to a HIGH state, after going through the inverter. Pre-decoded memory address input 177 may also be set to a HIGH state depending further on the memory address input 170b value.

To achieve higher independence from input signals, when the system clock signal 104 goes to HIGH state, matched storage node 110' can be discharged to LOW state. When reset signal 106 goes to HIGH state, Pre-decoded memory address input 177 and input signal inl 120 go to LOW state, allowing the latch circuit to turn ON. This allows for storage nodes 110 and 110' to be latched by the latch circuitry. Thereafter, system clock signal 104 may go to LOW state which leads to readyp signal 140 to go to LOW state, and storage nodes 110 and 110' to go to HIGH state. When nodes 110 and 110' go to a HIGH state, readyp signal 140 will go back to HIGH state and nodes 110 and 110' will remain at HIGH due to the latching effect. This allows for the storage nodes 110 and 110's values to remain independent from pre-decoded memory address input 177 and input signal 120 once they have been latched.

The use of low voltage domain circuitry, i.e., pre-decoder circuitry 112, to drive the latch circuitry may denote the latch circuitry as being weak, in that the latch circuitry may be minimized in size due to the low voltage domain driver circuit of memory pre-decoder 112. Because of that design consideration, the pulse latch circuit 102 may be very small in size and able to sustain the value of the storage nodes 110 and 110'.

The timing for reset signal generation is a very critical parameter. For example, it needs to fire every clock cycle. The reset may need to be HIGH, only when readyp signal 140 has gone HIGH. If reset arrives and opens the pull down of pulse latches earlier than common pull down vssg 118, one will observe a dip in the value of the storage node 110 because of charge sharing between storage node 110 and bottom Pull-down device 108. This dip may cause another word line pulse to be regenerated and sent, in a worst case scenario, and this outcome could result in a functional failure. As a result, a more advanced and robust matched circuit may be used as illustrated in more detail in FIG. 3.

FIG. 3 illustrates one example of a more robust pulse latch reset circuit and system. This is a similar layout as exemplary wireless communication system discussed in FIG. 3, with the addition of robust circuit 122 to increase robustness. This design allows for proper discharge of storage node 110' potential to ground without resulting in any durational problems, i.e. without delays. At this point, when storage node 110' reaches a LOW state, output signal 142' reaches a LOW state and reset signal 106 reaches a HIGH state after being inverted twice. This does not result in a reset as will be discussed further below.

As stated above, one preferred embodiment considers the use of a matched circuit to produce the reset signal 106 to reset the pulse latch circuit. The matched circuit can be configured to produce the reset signal 106 by being configured to mimic pulse latch circuit in design, performance, or layout. In on embodiment, for example, matched circuit 102' may include additional robust circuit 122 for optimal performance. Robust circuit 122 is composed of a P-channel FET 132 connected at the gate to the output of feedback stage circuit 102b' and storage output signal 142' at the drain. P-channel FET 132 is also connected in series to two N-channel FETs 134 and 130. N-channel FET 134 is connected at its source, to the drain of N-channel FET 130. N-channel FET 130 enables the connection between pulse latch circuit 102 and matched circuit 102' via common link vssg 118 at common pull down device, pull-down device 108.

The addition of robust circuit 122 would not allow for output signal 142' to discharge to ground in the same manner or rate as was previously discussed in FIG. 2. This is because when system clock signal 104 is in HIGH state, bottom pull-down device 108 (and vssg 118) as well as N-channel FET 130 output are at LOW states. Conversely, when system clock signal 104 goes to LOW state, bottom pull-down device 108 (and vssg 118) as well as N-channel FET 130 output will be set to HIGH state, which allows for output signal 142' to discharge to ground, resulting in a LOW state reset signal 106 that may reset the system. When the reset signal 106 is in LOW state, this causes the pre-decoded memory address input 177 to be in a HIGH state and thus causes the pull-down device 108 to turn ON.

In one embodiment, when system clock signal 104 is in HIGH state, storage node 110' is in a LOW, and the output at 142 and 142' would be in a HIGH state as well. This causes the drain of N-channel FET 130 to be in LOW state, causing the storage node 110' to go to HIGH state and pre-decoded memory address output 142 to go to LOW state and the reset signal 106 to be a LOW state as well. Having the reset signal 106 a low state in this scenario causes the pre-decoder to activate. The reason for the inclusion of a more robust circuit is that when considering the initial replica circuit of FIG. 2, when system clock signal 104 is in high state, readyp signal 140 and 140' at the matched circuit is in a LOW state and the pre-decoded memory address output 142 feeding the reset signal 106 is in LOW state. As described above, having the storage node 110' in LOW state when the system clock signal 104 is in HIGH state may lead to variations in the output circuitry and thus a more enhanced design can be further implemented as shown by robust circuit 122.

Timing is very critical for reset signal generation.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Figure 4:
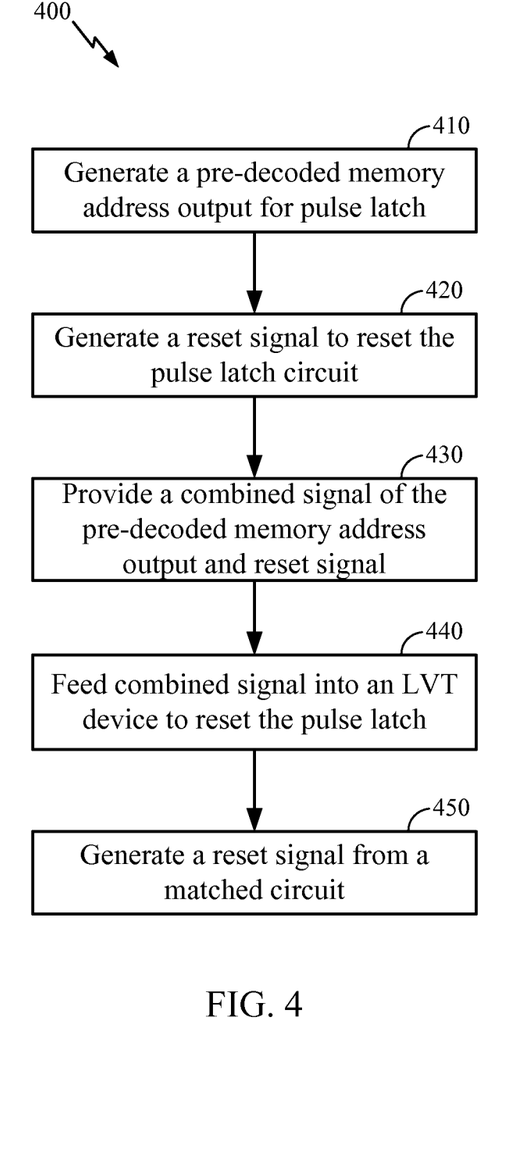
FIG. 4 is a flow diagram of global reset generation method for a pulse latch based pre-decoder memory circuit, showing one example of the reset generation method in accordance with an embodiment of the invention.

In yet another embodiment, FIG. 4 illustrates a global reset generation method 400 for a pulse latch based pre-decoders in memories. In one embodiment, the method would generate, 410, a pre-decoded memory address output for a pulse latch circuit, the method further configured to generate, 420, a reset signal to reset the pulse latch circuit. The global reset generation method may then provide, 430, a combined signal of the pre-decoded memory address output and the reset signal, wherein the method is further configured to feed, 440, the combined signal into a low voltage threshold (LVT) device to manipulate resetting the pulse latch circuit. The global reset generation method may then generate, 450, a reset signal from a matched circuit. The matched circuit may be configured to replicated the pulse latch circuit and provide a reset signal back to the pulse latch circuit. The matched circuit may be further configured to share a common pull-down with the pulse latch circuit and the pulse latch circuit may also be configured to be assembled in an array of pulse latch circuits.

Figure 5:
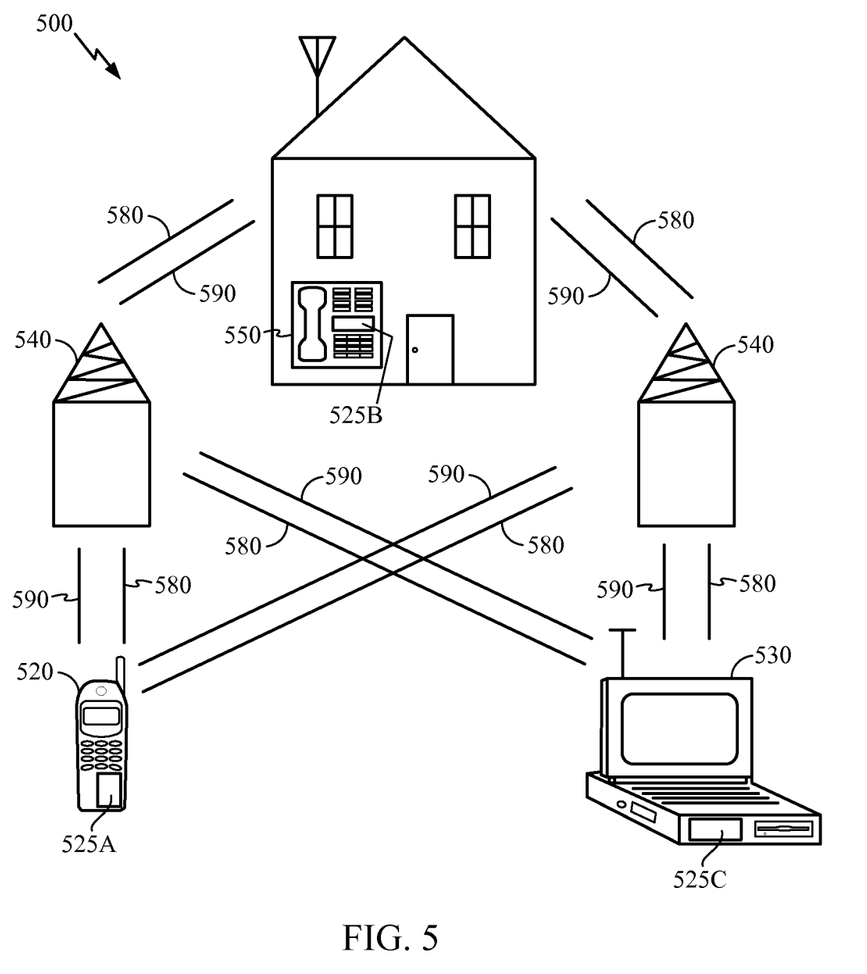
FIG. 5 is a block diagram showing an exemplary wireless communication system in which aspects of the disclosure may be advantageously employed.

With reference to FIG. 5, an exemplary wireless communication system 500 is illustrated, in which an embodiment of the disclosure may be advantageously employed. For purposes of illustration, FIG. 5 shows three remote units 520, 530, and 550 and two base stations 540. It will be recognized that typical wireless communication systems may have many more remote units and base stations. Remote units 520, 530, and 550 include a global reset with replica for pulse latch pre-decoders circuitry 525A, 525B, and 525C, respectively, which are aspects of the disclosure as discussed further below. FIG. 5 shows forward link signals 580 from the base stations 540 and the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 5 illustrates remote units according to the teachings of the disclosure, the disclosure is not limited to these exemplary illustrated units. The disclosure may be suitably employed in any device which includes a write sensor for selective word line boosting.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for global reset generation for pulse based pre-decoders. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A circuit comprising
a first latch circuit comprising a first node;
a pull-down transistor to pull the first node Low when ON, the pull-down transistor comprising a gate;
a pre-decoder coupled to the gate of the pull-down transistor; and
a second latch circuit to provide a reset signal to the pre-decoder, the reset signal is configured to turn off the pull-down transistor.

2. The circuit of claim 1, wherein the pre-decoder is configured to pre-decode a memory address input to generate a pre-decoded memory address output, wherein the pre-decoded memory address output is configured to be fed through the gate of the pull-down transistor.

3. The circuit of claim 1, further comprising a system clock coupled to the pull-down transistor, the system clock further configured to produce a clock signal that allows the first latch circuit to reset.

4. The circuit of claim 3, wherein the system clock and the pre-decoder both operate in a low voltage domain.

5. The circuit of claim 1, further comprising a second node, configured to provide an output.

6. The circuit of claim 1, wherein the second latch circuit is configured to match the first latch circuit.

7. The circuit of claim 6, wherein the second latch circuit further comprises:
a first matched node;
a matched pull-down transistor to pull the first matched node Low when ON, wherein the matched pull-down transistor comprises a matched gate and wherein the matched pull-down transistor is configured to share a common link with the pull-down transistor of the first latch circuit; and a second matched node configured to provide a matched output and wherein the matched output is configured to provide a reset signal to the pre-decoder to reset the first latch circuit.

8. The circuit of claim 6, wherein the second latch circuit further comprises a robust circuit element configured to allow timely discharge of the first matched node through the matched pull-down transistor in timely manner.

9. A global reset generation method for pulse latch based pre-decoders in memories comprising:
    providing at least one matched circuit and at least one pulse latch, wherein the at least one matched circuit mimics the at least one pulse latch and generates a reset signal telling the at least one pulse latch that new data has been latched successfully, wherein the at least one matched circuit shares a bottom pull down device with the at least one pulse latch, wherein a reset signal is fired when an actual pulse latch output node falls to Low.

* * * * *